US 6,636,367 B2

(12) United States Patent
Drodofsky et al.

(10) Patent No.: US 6,636,367 B2
(45) Date of Patent: Oct. 21, 2003

(54) PROJECTION EXPOSURE DEVICE

(75) Inventors: Ulrich Drodofsky, Oberkochen (DE);
Nils Dieckmann, Aalen (DE); Martin Antoni, Aalen (DE); Hans-Joachim Miesner, Oberkochen (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/955,921

(22) Filed: Sep. 19, 2001

(65) Prior Publication Data

US 2002/0085286 A1 Jul. 4, 2002

(30) Foreign Application Priority Data

Sep. 19, 2000 (DE) .......................................... 100 46 218

(51) Int. Cl.$^7$ ................................................ G02B 7/02
(52) U.S. Cl. ....................................................... 359/823
(58) Field of Search .................................. 359/853, 637

(56) References Cited

U.S. PATENT DOCUMENTS

| 5,532,497 | A | 7/1996 | Yasuzato et al. | ............. | 250/548 |
| 5,994,006 | A | 11/1999 | Nishi | ................. | 430/22 |
| 6,281,967 | B1 | 8/2001 | Kudo | ................. | 355/67 |

FOREIGN PATENT DOCUMENTS

| JP | 7-29816 A | 1/1995 |
| JP | 11-87232 | 3/1999 |

*Primary Examiner*—Hung Xuan Dang
*Assistant Examiner*—Joseph P Martinez
(74) *Attorney, Agent, or Firm*—Factor & Partners

(57) ABSTRACT

A projection exposure device (1), in particular for microlithography, serves to produce an image of an object (2) in an image plane (11) positioned in an object plane (10). For this reason the projection exposure device (1) has a radiation source (4) emitting projection radiation (5). Illumination optics (6) are positioned between the radiation source (4) and the object plane (10) and projection optics (8) are positioned between the object plane (10) and the image plane (11). A detection device (30) is provided to measure the illumination angle distribution of the projection radiation (5) in a field plane (10). This communicates via at least one control device (34, 18) with at least one manipulator (20, 45, 47). The latter serves to move at least one optical component (7, 41) within the projection ray path (5, 9). The illumination angle distribution changes as a result of the controlled movement of the optical component (7, 41). This can therefore be adjusted depending on the measurement result and for example adapted to the object structure.

15 Claims, 2 Drawing Sheets

PROJECTION EXPOSURE DEVICE

FIELD OF THE INVENTION

The invention relates to a projection exposure device, in particular for microlithography, to produce an image of an object positioned in an object plane in an image plane with a radiation source emitting projection radiation, with illumination optics positioned in the ray path between the radiation source and the object plane and projection optics positioned in the ray path between the object plane and the image plane.

BACKGROUND OF THE INVENTION

Where three dimensional structures are to be projected, for example in the case of transmitting three dimensional structures from a recticle onto a wafer in connection with micro-lithography, it has been shown that it is a matter not only of homogeneous as possible illumination of the object plane but also of well-defined distribution of the illumination angle in the object plane, i.e. the angles under which the projection radiation strikes the object plane. The illumination angle distribution to be set depends on how the structures are positioned on the recticle and what extension they have perpendicular to the object plane. For different recticle-structures therefore different illumination angle distributions to be preset for optimum projection can result.

With projection exposure devices known in the market illumination intensity is measured by a photosensor, which for example picks up the reflection of an optical component of the projection exposure device.

It is not possible to measure an illumination angle distribution with such a photosensor.

SUMMARY OF THE INVENTION

The present invention relates to further developments of a projection exposure device of the type described at the beginning so that the illumination angle distribution can be calculated and brought near to the desired distribution.

Accordingly, the present invention provides a projection exposure device in which:

a) a detection device is provided which measures the illumination angle distribution of the projection radiation in a field plane;

b) the detection device communicates via at least one control device with at least one manipulator to move at least one optical component within the ray path of the projection radiation; and c) at least one of the optical components is designed and arranged in the ray path of the projection radiation in such a way that the illumination angle distribution changes as a result of its controlled movement.

In this case for example projection light optical wavelengths, UV projection light or even EUV projection radiation, for example radiation with a wavelength of 13 nm, can be used as projection radiation.

An actual state of the illumination angle distribution is measured with the detection device. Measurement of the illumination angle distribution at the same time enables a further series of information which is of interest to the projection to be evaluated. For example it allows in a simple way the telecentre square distribution to be calculated in the measured field plane. In addition with the measured illumination angle distribution the distribution of the numerical aperture of the illumination light as well as the illumination intensity distribution is known via the measured field plane.

The field plane, the illumination angle distribution of which is measured, can in this case be the object plane itself or a plane conjugated to this.

With the aid of the control device and at least one allocated manipulator it is possible via movement of at least one optical component to adapt the measured illumination angle distribution to a standard value. In this case one manipulator or several manipulators can be provided for a component. With the aid of such adaption it is possible for example depending on the structure to be projected to obtain optimum illumination of the object.

The detection device can have: an aperture, which can be positioned in a field plane, a position resolving sensor to record the radiation passing through the aperture and a drive mechanism to move the aperture together with the sensor in the field plane. With this relatively simple configuration, precise measurement of the illumination angle distribution in the field plane is possible. The diameter of the aperture in this case determines the position resolution in the field plane. The detection device is moved over the total field plane to be measured by means of the drive mechanism. With such a detection device the illumination intensity distribution in the field plane can also be measured.

The position resolving sensor can be a CCD-array. A CCD-array is light-sensitive and has a high position resolution. With the aid of known coatings the sensitivity of the CCD-array can be extended as far as the illumination wavelength range of the UV wavelengths interesting for micro-lithography. If only a minimum position resolution is required for the position resolving sensor, this can also be designed for example as a simple quadrant detector.

At least one optical deflection element can be positioned in the ray path between the aperture and the position resolving sensor. This reduces the overall depth of the detection device in the direction of the optical axis. Precisely in the case of projection exposure devices, with high structural integration, the space in which the detection device can be placed is very restricted.

At least one filter can be positioned in the ray path between the aperture and the position resolving sensor. The filter can include a spectral filter, so that for example only the interesting illumination wavelength is allowed through. An example of such a filter is a notch filter. Other wavelengths, which could interfere with the measurement under certain circumstances, are suppressed.

Alternatively or in addition, the filter can have a grey filter or a reflection filter to attenuate a greater wavelength range in a neutral way.

At least one lens can be positioned in the ray path between the aperture and the position resolving sensor. Such a lens can for example increase the resolution of the detection device.

An optical component acting in conjunction with the manipulator can be a filter. With a filter it is possible to achieve specific range-wise attenuation of the projection light bundle. The filter can be designed as an absorption or reflection filter. Instead of a filter with a moveable filter component, in the case of which when the moveable filter component is moved the transmission in the filter plane is altered, an exchange holder can be provided for a number of replaceable filters.

The filter can be placed in the vicinity of a field plane of the projection optics. If the filter is placed in or near a field plane in practice it only influences the illumination intensity distribution in the object plane, not however the illumination angle distribution there.

Alternatively the filter can be positioned in the vicinity of a pupil plane of the projection optics. Such a filter positioned in or near a pupil plane of the projection optics influences the illumination intensity in this plane and as a result serves to determine the illumination angle distribution in the object plane, while the illumination intensity distribution in the object plane is not influenced or hardly influenced at all. Accordingly the illumination angle distribution is changed by displacing the filter or the moveable filter component with the aid of the manipulator.

At least one Z-manipulator can be provided for an optical component of the projection optics as manipulator. The Z-direction in this case is the direction in which the optical axis of the projection optics runs. Also it is possible to change the illumination angle distribution by means of the Z-manipulation of optical components.

Such an optical component can be a lens. With the aid of a Z-manipulatable lens, apart from the illumination angle distribution, in addition an image error of the projection exposure device can be corrected.

Another kind of Z-manipulated optical component can be an axicon. With the aid of an axicon a controlled changeable rotation-symmetrical illumination angle distribution can be set in a simple way.

A manipulatable optical component can be a device to adjust the radiation source. With the aid of the adjustment device, for example the divergence of the projection radiation bundle radiated from the radiation source can be adjusted. This is an additional influence parameter for the illumination angle distribution.

The manipulator can have a piezo element. With piezo elements reproducible and precise displacement can be achieved. If several piezo elements are used to manipulate an optical component, apart from the Z-position the inclination of the optical component can be set against the optical axis.

Apart from the aforementioned manipulatable optical components, others are again conceivable to influence the illumination angle distribution. Examples of these are camera wedges which can be displaced against each other, tiltable or Z-manipulatable plan-parallel optical plates, aperture shutters with changeable opening or, in the case of catadioptric projection objectives, active mirrors.

INTRODUCTION OF THE DRAWINGS

DESCRIPTION OF THE EMBODIMENTS

Figure 1:
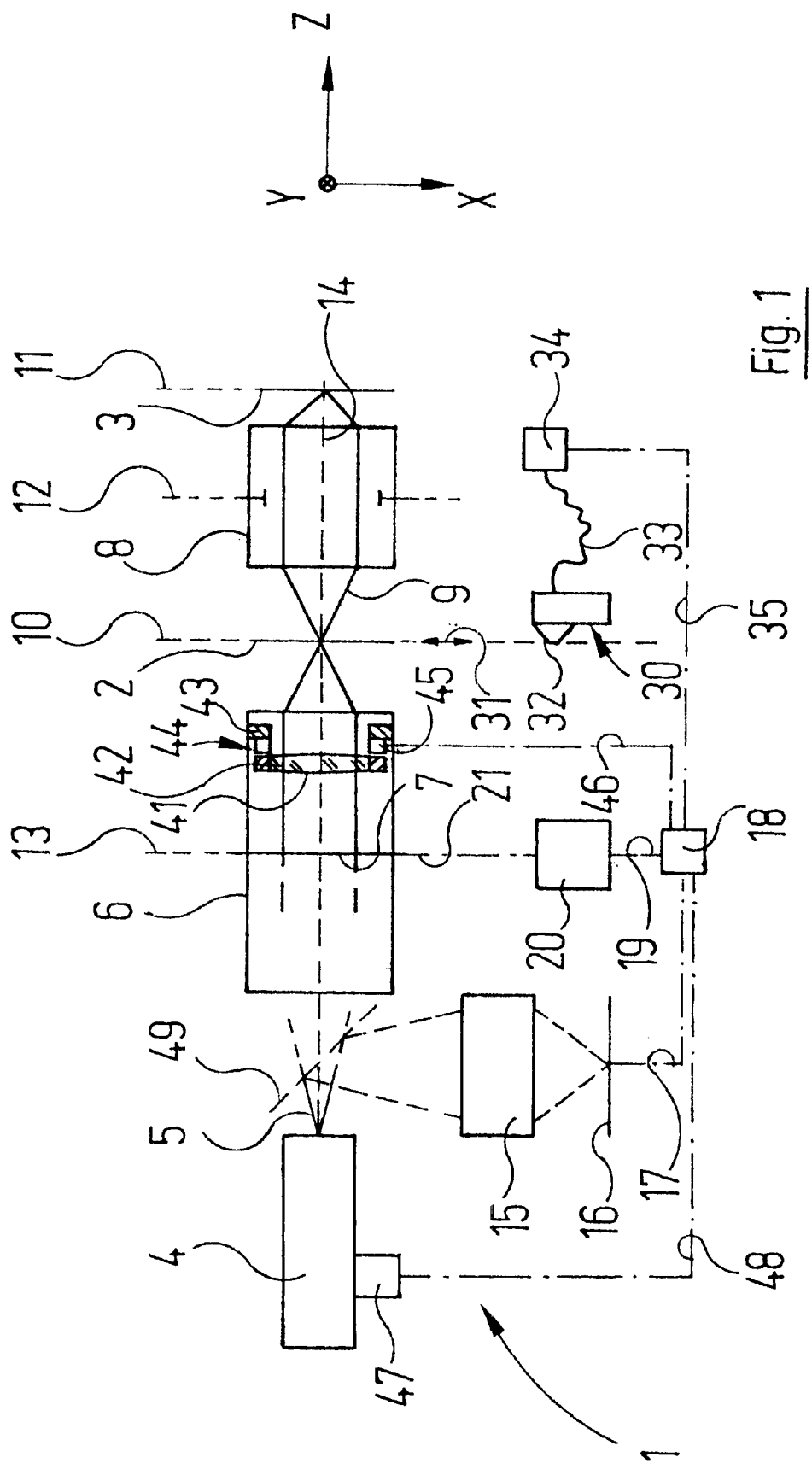
FIG. 1 is a diagrammatic overview of a projection exposure device.

In FIG. 1 a complete projection exposure device for micro-lithography with the reference 1 is illustrated diagrammatically. With this a structure on a recticle 2 is transferred onto the surface of a wafer 3.

A UV laser 4, for example an ArF excimer laser with a wavelength of 193.3 nm serves as radiation source for the projection exposure device 1.

A controlled adjustment device 47 is coupled with the UV laser 4. This case for example concerns one or several micrometer screws coupled with an actuator. The adjustment device 47 is placed on an optical component of the UV laser 4 and connected via a control line 48 with a control device 18.

A projection light bundle 5 emitted by the W-laser 4 first enters illumination optics 6. The ray path of the projection light bundle 5 is only indicated for the sake of clarity between the UV laser 4 and the illumination optics 6. The illumination optics 6 is for the most part shown in FIG. 1 diagrammatically as a block and apart from lenses and possibly also mirrors can have a further series of optical elements or sub-assemblies, for example a zoom-lens, an axicon, a moveable camera wedge, diffractive optical elements, a filter and a glass rod to pre-set an illumination intensity distribution and an illumination angle distribution of the projection light bundle 5. All these optical components can be moved in a controlled way.

Representing an optical element within the illumination optics 6 a lens 41 is shown which is arranged in a lens mount 42 surrounding it. In a way not illustrated the lens mount 42 is clamped against a retaining ring 43. The latter on its outer circumferential face is rigidly connected with a housing of the illumination optics 6.

In the axial direction to the illumination optics 6 a group of piezo actuators 44 is placed between the lens mount 42 and the retaining ring 43. This includes several individual piezo actuators 45, of which two are illustrated in FIG. 1.

The piezo actuators 45 communicate with the control device 18 via a multi-pole control line 46 shown as a broken and dotted line.

In its journey through the illumination optics 6 the projection light bundle 5 passes a pupil filter 7 positioned in a pupil plane 13, which is shown in the illumination optics 6 likewise representing optical components arranged there. The pupil plane 13 is also designated filter plane below.

The projection light bundle 5 leaving the illumination optics 6 illuminates the recticle 2. The structures of the recticle 2 are projected with the aid of projection optics 8 onto the surface of the wafer 3. The projection optics 8 can be constructed from a number of lenses and/or mirrors.

A selected image light bundle passing a central object point on the recticle 2 and fed with the projection optics 8 is shown in FIG. 1 with the reference 9 and to make the image ray path clear extended a little further in the opposite direction, therefore in the direction onto and in the illumination optics 6. The recticle 2 lies in the object plane 10 of the projection optics 8, which is indicated in FIG. 1 by a broken line. The object plane 10 coincides with a collimation plane of the projection light bundle 5. The wafer 3 lies in an image plane 11 of the projection optics 8, likewise indicated by a broken line. A pupil plane 12 of the projection optics 8 is likewise diagrammatically indicated in FIG. 1. It is conjugated to the filter plane 13 in the illumination optics 6.

The optical axis of the projection exposure device is likewise indicated as a broken line in FIG. 1 and given the reference 14. It runs in the Z direction of the cartesian coordinate system X, Y and Z illustrated in FIG. 1 on the right.

A partly permeable optical plate 49 is placed in the ray path between the UV laser 4 and the illumination optics 6 which reflects a small amount of the projection light bundle 5 and the greater majority, in practice more than 99%, of the projection light bundle 5 is transmitted. The ray path of the projection light bundle 5 passing through the optical plate 49, since here it is no longer of interest, is only continued a little further with a broken line.

The reflected amount, likewise illustrated as a broken line, of the projection light bundle 5 after the optical plate 49 is mapped by means of image optics 15 onto a two-dimensional CCD-array 16. With this the intensity distribution of the projection light bundle 5 can therefore be picked up.

The CCD-array 16 communicates via a signal line 17 illustrated as a broken and dotted line with the control device 18.

A detection device 30 which can be used alternatively or in addition to the CCD-array 16 to measure the illumination intensity and the illumination angle distribution of the image bundle 9 in the object plane 10 is shown in FIG. 1 in an inactive position outside the projection ray path. By means of a drive mechanism, not illustrated, the detection device 30 in the X,Y plane perpendicular to the optical axis 14, as illustrated by the double arrow 31, after removing the recticle 2 can be pushed into the ray path in such a way that an inlet opening 32 designed as aperture lies in the object plane 10. As a result of this an image bundle 9 normally illuminating the recticle can enter inside the detection device 30.

The detection device 30 is connected via a flexible signal line 33 with a detection control device 34, which in its turn communicates via a signal line 35 illustrated by a broken and dotted line with the control device The control device 18 triggers via a signal line 19, which likewise is illustrated as a broken and dotted line, a drive mechanism 20, which causes via a drive connection 21, likewise illustrated as a broken and dotted line, an element of the pupil filter 7 to turn around the optical axis 14. The rotatable element of the pupil filter has a transmission distribution which is not rotation-symmetrical around the rotational axis.

In addition the control device 18 drives via a control line 48 the adjustment device 47 to displace the related optical component of the UV laser 4.

Figure 2:
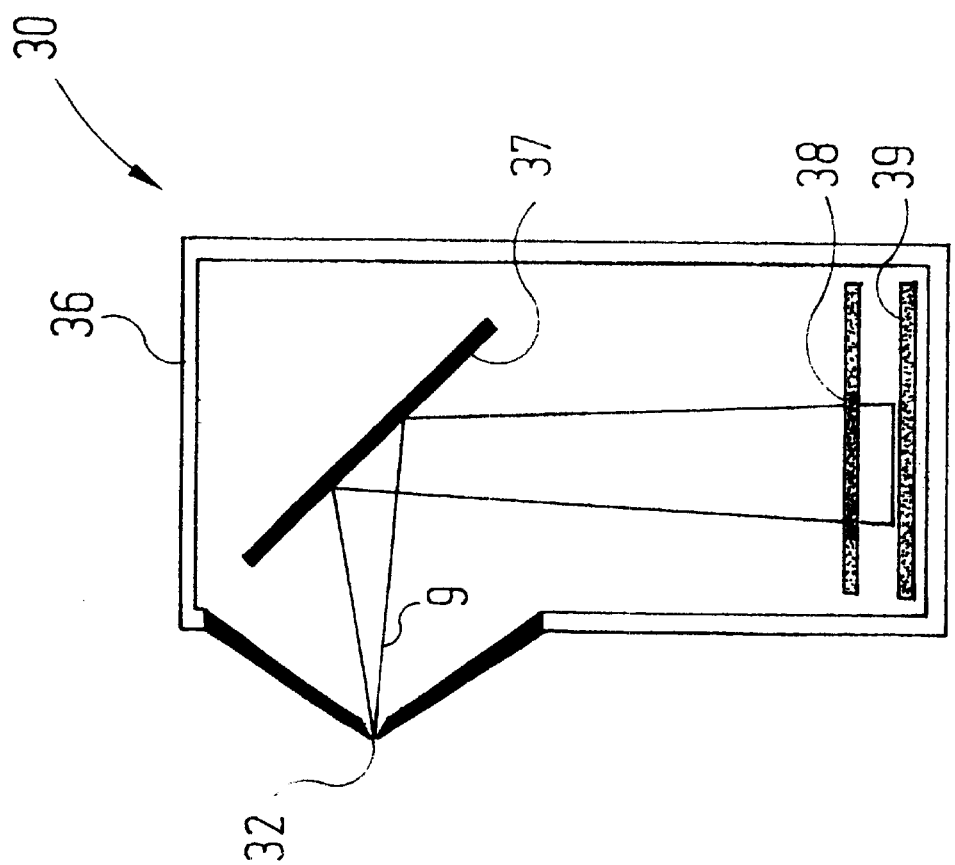

The image bundle 9 selected by the position of the inlet opening 32 of the detection device 30 enters a housing 36 of the detection device 30 through the inlet opening 32 (compare FIG. 2). The width of the inlet opening 32 as well as the precision with which the plane of the inlet opening 32 can be brought into line with the object plane 10, determines the resolution of the detection device 30.

The image bundle 9 is deflected by 90° through a mirror 37. This occurs for reasons of space, in order to reduce the overall length of the detection device 30 in the direction of the optical axis 14. After reflection on the mirror 37 the image bundle 9 passes through a spectral filter 38, which lets through the wavelength of the image bundle 9, but blocks other wavelengths. An example of the spectral filter 38 is a notch filter. After passing through the spectral filter 38 and possibly a further filter, not illustrated, this strikes a two-dimensional CCD-array 39 for non colour-selective attenuation of the image bundle 9.

In order to increase the sensitivity of the CCD chips, which for example can be of the "front illuminated" type, for the spectral range of illumination wavelengths less than 350 nm, a coating of phosphorus is deposited on the CCD chip surface.

The detection device 30 works as follows:

After removing the recticle 2 the detection device 30 is driven into the exposed area of the object plane 10. Next with homogeneous illumination as a result of the projection light bundle 5 it is finely set in the direction of the optical axis 14 (Z-direction), until the plane of the inlet opening 32 is in line with the object plane 10. With this fine adjustment controlled by the detector control device 34 the inlet opening 32 with fixed X and Y position is driven step by step in the Z-direction. The positioning range in the Z-direction is pre-set so that the object plane 10 and therefore also the collimation plane of the projection light bundle 5 lies safely in the positioning range. With each step the illumination light volume falling onto the CCD-array 39, therefore the amount of the image bundle 9 passing through the inlet opening 32, is integrated and read-out. The Z-position of the inlet opening 32, in the case of which the illumination-light volume read-out is at maximum, controlled by the detector control device 34, is lined up with the inlet opening 32.

This fine adjustment process can be repeated at different X,Y positions.

Next, the detection device 30 is scanned in X and Y direction in the X,Y-plane relating to this Z-position in a raster type way over the total illuminated area of the object plane. This is likewise controlled by the detector control device 34, which also pre-sets the raster step size. At each raster element the two dimensional intensity distribution of the image bundle 9 picked up by the individual pixels of the CCD-array 39 relating to the particular raster element is read out.

As a result of the fine adjustment process at different X,Y positions the planes to be scanned can be pre-set precisely.

From the measurement taken at a particular raster element the following information can be gained:

The intensity distribution picked up at the raster element corresponds to the image light distribution, to which an object point on the recticle 2, which when recticle 2 is pushed in assumes the position of the raster element, is exposed.

It can be evaluated in the following way:

The size of the exposed face on the CCD-array 39 is a direct measurement for the numerical aperture of the image bundle 9 at the particular raster element. In addition the centre of gravity of the measured intensity distribution can be compared with a zero point determined by means of a standard measurement so that the telecentre square, which relates to the particular raster element, can be calculated. The intensity distribution of the illuminated face on the CCD-array 39 finally provides direct information about the illumination angle distribution for the image bundle 9 at the particular raster element.

By moving the inlet opening 32 of the detection device 30 and scanning the exposed area of the object plane 10 the following further information can be gained: The intensity distribution of the illumination light over the object plane 10 and furthermore the distribution of the numerical aperture as well as of the telecentre square over the object plane 10 for all raster elements.

This data is fed via the signal line 33 to the detector control device 34, in which the actual values of the intensity distribution, the numerical aperture, the telecentre square distribution and the illumination angle distribution are compared with pre-set ideal values.

To adapt if necessary the actual values to the ideal values the adjustment device 47, the drive mechanism 20 for the pupil filter 7 and the actuator group 44 for the lens 41 are controlled accordingly via the signal lines 48, 19 and 46 and the control device 18.

The projection exposure device 1 functions in the following way:

Depending on the type of structure to be projected with the projection exposure device 1, the appearance of the illumination intensity distribution and the illumination angle distribution of the projection light bundle 5 in the object plane 10 containing the recticle 2 is preset.

An intensity distribution of the projection light bundle 5 in the pupil plane 13 is allocated to the illumination angle distribution in the object plane 10. The intensity distribution to be adjusted there to achieve a desired illumination angle distribution can for example be a constant intensity path over the bundle profile.

Depending on the structure to be mapped however any other desired intensity distribution of the light bundle 5 in the pupil plane 13, so-called illumination settings, can also be preset. With certain structures for example an annular illumination setting, i.e. an illumination type, in regard to which the intensity distribution has the greatest intensity in the pupil plane 13 in a circular area around the optical axis 14, is suitable. Depending on the symmetry of the structure on the recticle 2 other illumination settings can be adjusted for optimum projection, for example with multiple symmetry in the circumferential direction. An example of the latter illumination type is quadrupole illumination.

The illumination intensity distribution in the object plane 10, therefore in a field plane, must be distinguished from the illumination intensity distribution in the plane of the pupil filter 7. A desired illumination intensity distribution in the object plane is for example homogeneous intensity distribution of the projection light bundle 5.

A desired telecentre square distribution is for example a heavy ray parallel to the optical axis 14 for all object points, therefore illumination optics 6 telecentric on the object side.

A desired numerical aperture of the projection light bundle 5 for example makes total use of the numerical aperture of the illumination optics. This illumination type with both homogeneous illumination intensity distribution and illumination angle distribution is known as conventional illumination setting. Alternatively a numerical aperture of the projection light bundle 5 can also be desired, which is considerably less than that of the illumination optics 6. This is known as a coherent illumination setting.

Reset values for the projection exposure device 1 are calculated in the control devices 18 and 34 from the intensity distribution of the projection light bundle 5 measured with the aid of the CCD-array 16 and/or the detection device 30 before and/or after the illumination optics 6 and the illumination angle distribution in the object plane 10 measured with the detection device 30 and the ideal values for the illumination angle distribution and the illumination intensity distribution in the object plane 10.

These reset values predetermine a position of the rotatable element of the pupil filter 7, a position of the adjustment device 47 for the UV laser 4 as well as a position of the piezo actuators 45 of the actuator group 44 for the lens 41.

As additional input values to calculate the reset values yet more information can be obtained which is automatically fed to the control devices 18 and 34. Such input values are for example structure information allocated to the particular recticle, which for example can be read via a barcode applied on the recticle 2 or information about environmental parameters such as pressure, temperature or air humidity, which are provided by corresponding sensors.

If for example the intensity distribution of the projection light bundle 5 measured with the CCD-array shows that the UV laser must be re-adjusted, the adjustment device 47 is driven accordingly. The affects of the adjustment can be followed online via the CCD-array 39.

To change the illumination setting the moveable element of the pupil filter 7 as well as the lens 41 which can be manipulated via the actuator group 44 is available. The numerical aperture can also be re-adjusted via the adjustment device 47.

The drive mechanism 20 is driven via the control device 18 to change the illumination settings for example so that the desired transmission path is set by turning the rotatable filter element of the pupil filter 7.

The telecentre square distribution or the heavy ray path of the image bundle can be influenced by manipulating the actuator group 44. In this case by simultaneously changing the length of the piezo actuators 45 the lens 41 can be correspondingly Z-manipulated by the same amount in the Z-direction. If on the other hand the piezo actuators 45 are driven differently via the control line 46, the inclination of the symmetry axis of the lens 41 to the optical axis 14 can be adjusted.

To set an illumination intensity path in the object plane 10, alternatively or in addition a further filter with a moveable filter element near a field plane, for example near the object plane 10, can be used. Such a filter is known for homogenising the illumination intensity in the object plane 10.

It has been described above how the illumination angle distribution and the illumination intensity distribution in the object plane can be measured by the detection device. Alternatively or in addition in same way with the CCD-array 39 the intensity distribution can be picked up in any other desired illumination plane of the projection exposure device 1. Examples of such planes are the image plane 3 or the pupil planes 12, 13.

The projection can be exposed after re-adjusting the controlled moveable optical components.

An alternative detection device to measure the illumination distribution of the projection exposure device 1 in the object plane 10 is described below by way of FIG. 3. Components, which correspond to those which have already been explained in connection with embodiment examples described earlier, are shown with references increased by 100 and are not further discussed in detail.

Figure 3:
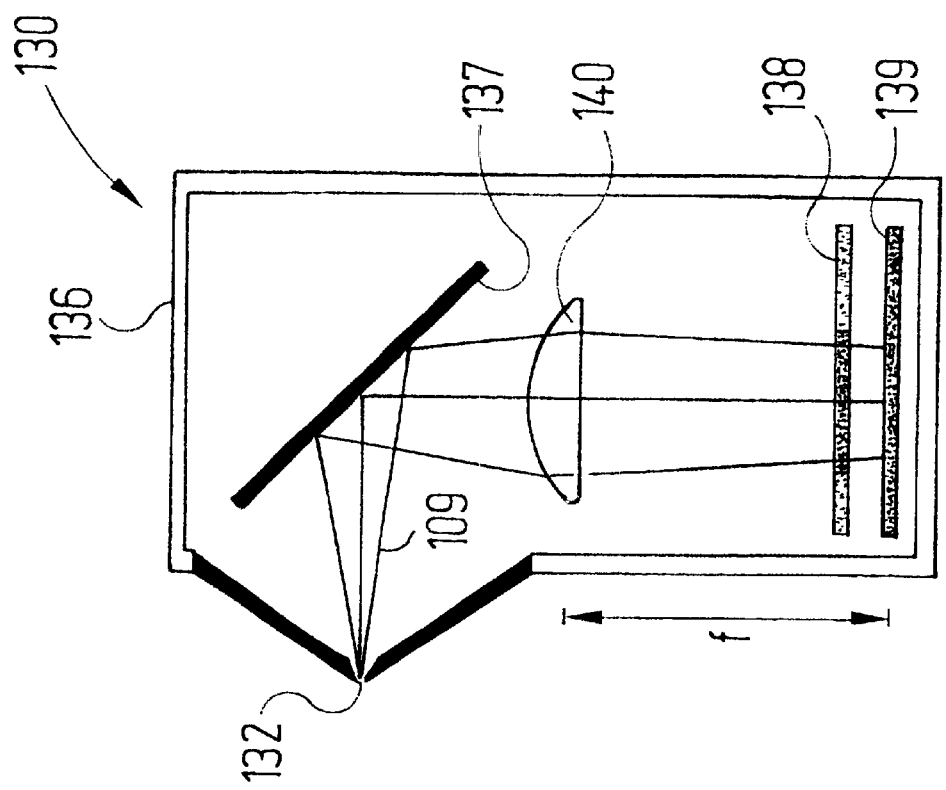
FIGS. 2 and 3 show two embodiment examples of a detection device for an illumination angle distribution and an illumination intensity distribution in an object plane of the projection exposure device

In regard to the alternative embodiment example of a detection device 130 shown in FIG. 3, a lens 140 with positive refractive power is positioned between the tilted mirror 137 and the spectral filter 138. The lens increases with a given size of the housing 136 the maximum measurable telecentre square and raises the angle resolution, since image bundles 109, which due to a greater telerentre square are relatively heavily inclined to the optical axis, are again steered in the direction of the CCD-array 139.

What is claimed is:

1. A projection exposure device to produce in an image plane an image of an object that is positioned in an object plane with a radiation source emitting projection radiation, with illumination optics positioned in the ray path between the radiation source and the object plane and projection optics positioned in the ray path between the object plane and the image plane, comprising:

a) at least one optical component positioned within the ray path of the projection radiation;
   b) a detection device capable of measuring the illumination angle distribution of the projection radiation in a field plane; and
   c) at least one control device capable of placing the detection device in communication with at least one manipulator to, in turn, move the at least one optical component; wherein
       at least one of the at least one optical component being designed and placed in the ray path of the projection radiation in such a way that by its controlled movement of the at least one optical component changes the illumination angle distribution.

2. The projection exposure device according to claim 1, in which the detection device includes:

an aperture positionable in a field plane, a position resolving sensor capable of recording the radiation passing through the aperture; and a drive mechanism capable of moving the aperture together with the position resolving sensor in the field plane.

3. The projection exposure device according to claim 2, in which the position resolving sensor comprises a CCD-array.

4. The projection exposure device according to claim 2, which at least one optical deflection element is placed in the ray path between the aperture and the position resolving sensor.

5. The projection exposure device according to claim 2, in which at least one filter is positioned in the ray path between the aperture and the position resolving sensor.

6. The projection exposure device according to claim 2, in which at least one lens is placed in the ray path between the aperture and the position resolving sensor.

7. The projection exposure device according to claim 1, in which the at least one optical component comprises a filter.

8. The projection exposure device according to claim 7, in which the filter is placed in the vicinity of a field plane of the projection optics.

9. The projection exposure device according to claim 7, in which the filter is placed in the vicinity of a pupil plane of the projection optics.

10. The projection exposure device according to claim 1, in which the at least manipulator comprises at least one Z-manipulator.

11. The projection exposure device according to claim 10, in which the at least one optical component comprises a lens.

12. The projection exposure device according to claim 10, in which the at least one optical component comprises an axicon.

13. The projection exposure device according to claim 1, which the at least one optical component comprises a device capable of adjusting the radiation source.

14. The projection exposure device according to claim 1, in which the manipulator includes a piezo element.

15. A projection exposure device to produce in an image plane an image of an object that is positioned in an object plane with a radiation source emitting projection radiation, with illumination optics positioned in the ray path between the radiation source and the object plane and projection optics positioned in the ray path between the object plane and the image plane, comprising:

a) at least one optical component positioned within the ray path of the projection radiation;

b) a detection device capable of measuring the illumination angle distribution of the projection radiation in a field plane; and c) at least one control device capable of placing the detection device in communication with at least one manipulator to, in turn, move the at least one optical component; wherein at least one of the at least one optical component being designed and placed in the ray path of the projection radiation in such a way that by its controlled movement of the at least one optical component changes the illumination angle distribution, and wherein the at least one manipulator comprises a Z-manipulator.

* * * * *